(12) United States Patent
Chang et al.

(10) Patent No.: US 7,911,268 B2
(45) Date of Patent: Mar. 22, 2011

(54) APPARATUS AND METHOD FOR IMPROVING THE FEEDBACK LINEARITY OF A 1.5-BIT SIGMA-DELTA CLASS-D AMPLIFIER

(75) Inventors: Teng-Hung Chang, Kaohsiung (TW); Jwin-Yen Guo, Jhubei (TW)

(73) Assignee: Richtek Technology Corp., Hsinchu (TW)

( * ) Notice: Subject to any disclaimer, the term of this patent is extended or adjusted under 35 U.S.C. 154(b) by 34 days.

(21) Appl. No.: 12/318,659

(22) Filed: Jan. 6, 2009

(65) Prior Publication Data
US 2009/0174472 A1   Jul. 9, 2009

(30) Foreign Application Priority Data
Jan. 8, 2008 (TW) .............................. 97100733 A

(51) Int. Cl.
*H03F 3/38* (2006.01)

(52) U.S. Cl. .......................................... 330/10; 330/251
(58) Field of Classification Search .................... 330/10, 330/251, 207 A
See application file for complete search history.

(56) References Cited

U.S. PATENT DOCUMENTS

| | | | | |
|---|---|---|---|---|
| 5,815,037 | A * | 9/1998 | Tomasini et al. | 330/69 |
| 6,750,703 | B1 * | 6/2004 | Shen et al. | 330/9 |
| 6,914,479 | B1 * | 7/2005 | Gabillard et al. | 330/69 |
| 7,479,826 | B2 * | 1/2009 | Yoshizawa et al. | 330/9 |

* cited by examiner

*Primary Examiner* — Henry K Choe
(74) *Attorney, Agent, or Firm* — Rosenberg, Klein & Lee

(57) ABSTRACT

A conversion circuit is provided for a 1.5-bit Σ-Δ class-D amplifier to improve the feedback linearity of the class-D amplifier, by periodically inverting and mixing a first positive feedback signal and a first negative feedback signal from the power stage of the class-D amplifier to generate a second positive feedback signal and a second negative feedback signal with better linearity for feedback control in the class-D amplifier.

11 Claims, 7 Drawing Sheets

APPARATUS AND METHOD FOR IMPROVING THE FEEDBACK LINEARITY OF A 1.5-BIT SIGMA-DELTA CLASS-D AMPLIFIER

FIELD OF THE INVENTION

The present invention is related generally to class-D amplifiers and, more particularly, to a 1.5-bit sigma-delta (Σ-Δ) class-D amplifier.

BACKGROUND OF THE INVENTION

Generally, class-D amplifiers can be classified into a pulse-width modulation (PWM) type and a sigma-delta (Σ-Δ) type, and the Σ-Δ class-D amplifiers can be further classified into 1-bit Σ-Δ class-D amplifiers and 1.5-bit Σ-Δ class-D amplifiers. The terms "1-bit" and "1.5-bit" refer to the number of voltage levels outputted from a quantizer, also known as "resolution". More specifically, "1-bit" means that an input signal is quantized into two voltage levels, for example with the logic "0" and logic "1", as disclosed in U.S. Pat. No. 5,777,512 to Tripathi et al. Due to high switching loss, 1-bit Σ-Δ class-D amplifiers have low conversion efficiency under small or no input signal conditions. To reduce the switching loss and thereby improve the conversion efficiency, 1.5-bit Σ-Δ class-D amplifiers have been proposed, for example by U.S. Pat. Nos. 5,077,539 and 7,170,340, which quantize an input signal into three voltage levels.

FIG. 1 is a block diagram of a 1.5-bit Σ-Δ class-D amplifier 10 which includes a control circuit having three integrators 12, 14 and 16, each may be of a continuous-time type or a discrete-time type, to convert differential input signals VINP and VINN that are in opposite phases to each other into signals SOP and SON, and a 1.5-bit quantizer 18 to quantize the signals SOP and SON into a digital signal having three voltage levels for a switching logic 20 to operate a power stage 22.

FIG. 2 shows a typical circuit of the power stage 22. By using the switching logic 20 to determine control signals UGA, LGA, UGB and LGB, the quantized digital signals +1, 0 and −1 may switch the MOSes 26, 28, 30 and 32 in an H-bridge to provide different voltages for a load 40. For example, Table 1 lists the switching logics, i.e., the output of the 1.5-bit quantizer 20 and the status of the H-bridge. When the quantized output is +1, the MOSes 26 and 32 are turned on and the MOSes 28 and 30 are turned off, in which case current will flow from the voltage supply Vdd to the ground terminal GND through the MOS 26, the load 40 and the MOS 32, and the voltage across the load 40 is a first voltage. When the quantized output is −1, the MOSes 26 and 32 are turned off and the MOSes 28 and 30 are turned on, in which case current will flow from the voltage supply Vdd to the ground terminal GND through the MOS 30, the load 40 and the MOS 28, and the voltage across the load 40 is a second voltage. When the quantized output is 0, the MOSes 28 and 32 are turned on and the MOSes 26 and 30 are turned off, in which case the differential output terminals 34 and 36 are both grounded, and the voltage across the load 40 is zero.

TABLE 1

| Quantized Output | Status of H-bridge |
| --- | --- |
| +1 | UGA, LGB off; UGB, LGA on |
| −1 | UGB, LGA off; UGA, LGB on |
| 0 | LGA, LGB off; UGA, UGB on |

1.5-bit Σ-Δ class-D amplifiers have higher resolution and better efficiency than 1-bit Σ-Δ class-D amplifiers, but suffer from nonlinear variation of the voltage across the load 40. Ideally, the MOSes 26 and 30, the voltage divider resistors R1-R4 in the H-bridge are matched with each other such that the voltage across the load 40 will vary in a linear way. For example, as shown by the dashed straight line 104 in FIG. 3, if the first voltage is 1V, then the second voltage will be −1V, and the voltage across the load 40 varies linearly. In real circuits, however, the MOSes 26 and 30, the resistors R1-R4 are generally mismatched with each other. For example, as shown by the curve 102 in FIG. 3, the first voltage will be 1.1V when the quantized output is +1, the second voltage will be −0.9 V when the quantized output is −1, and the voltage across the load 40 is still zero when the quantized output is 0. Thus, the curve 102 is not a straight line, and the voltage across the load 40 varies nonlinearly. This nonlinear output is divided by the resistors R1, R2 and R3, R4 to generate feedback signals LX_P and LX_N for the integrator 12, and causes the large harmonic distortions (THD+N) in the output spectrum, leading to degradation in THD+N of the class-D amplifier.

U.S. Pat. No. 6,472,933 to Hsu teaches a quaternary switching method for the H-bridge, which switches the H-bridge between four states, i.e. +1, 0H, 0L and −1, to improve the linearity in the voltage variation across the load to improve the THD+N.

SUMMARY OF THE INVENTION

An object of the present invention is to provide an apparatus to improve the feedback linearity of a 1.5-bit Σ-Δ class-D amplifier.

Another object of the present invention is to provide a method to improve the feedback linearity of a 1.5-bit Σ-Δ class-D amplifier.

According to this invention, an apparatus for improving the feedback linearity of a 1.5-bit Σ-Δ class-D amplifier comprises a conversion circuit to periodically invert and mix a first positive feedback signal and a first negative feedback signal to generate a second positive feedback signal and a second negative feedback signal with better linearity for the control circuit of the 1.5-bit Σ-Δ class-D amplifier to practice the feedback control.

BRIEF DESCRIPTION OF THE DRAWINGS

These and other objects, features and advantages of the present invention will become apparent to those skilled in the art upon consideration of the following description of the preferred embodiments of the present invention taken in conjunction with the accompanying drawings, in which.

DETAILED DESCRIPTION OF THE INVENTION

Figure 4:
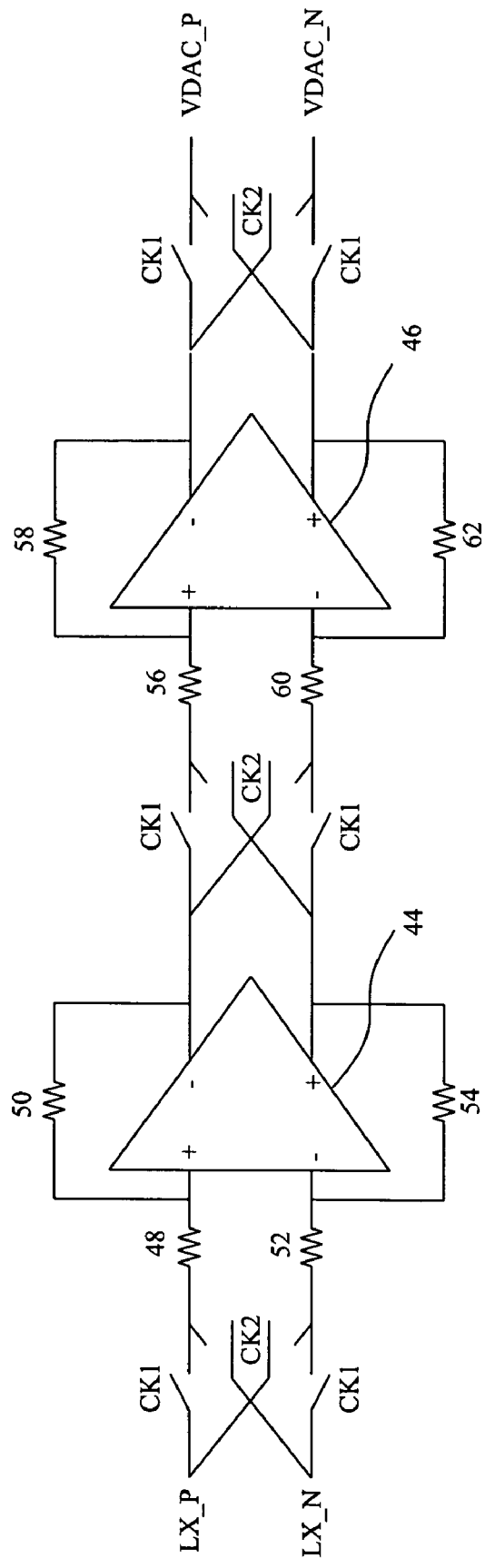
FIG. 4 shows an embodiment according to the present invention.

FIG. 4 is the circuit diagram of an embodiment according to the present invention. In this embodiment, a conversion circuit is added in the feedback path of a 1.5-bit Σ-Δ class-D amplifier to invert and mix the original feedback signals, so as to improve the feedback linearity by generating a chopper average. The conversion circuit of FIG. 4 includes several switches and two operational amplifiers 44 and 46 connected in series, and two groups of resistors 48-54 and 56-62 so configured that each of the operational amplifiers 44 and 46 has a positive unit gain and a negative unit gain. Control signals CK1 and CK2 are clocks with a fixed period to switch the switches to establish various signal paths through the operational amplifiers 44 and 46.

Figure 1:
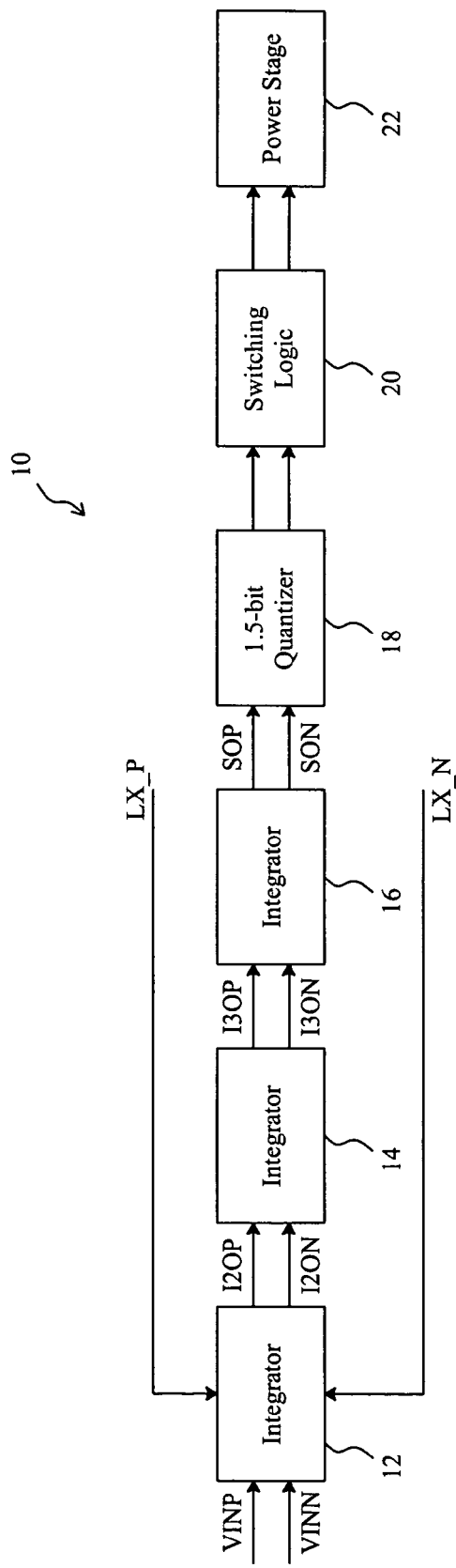
FIG. 1 is a block diagram of a conventional 1.5-bit Σ-Δ class-D amplifier.
Figure 2:
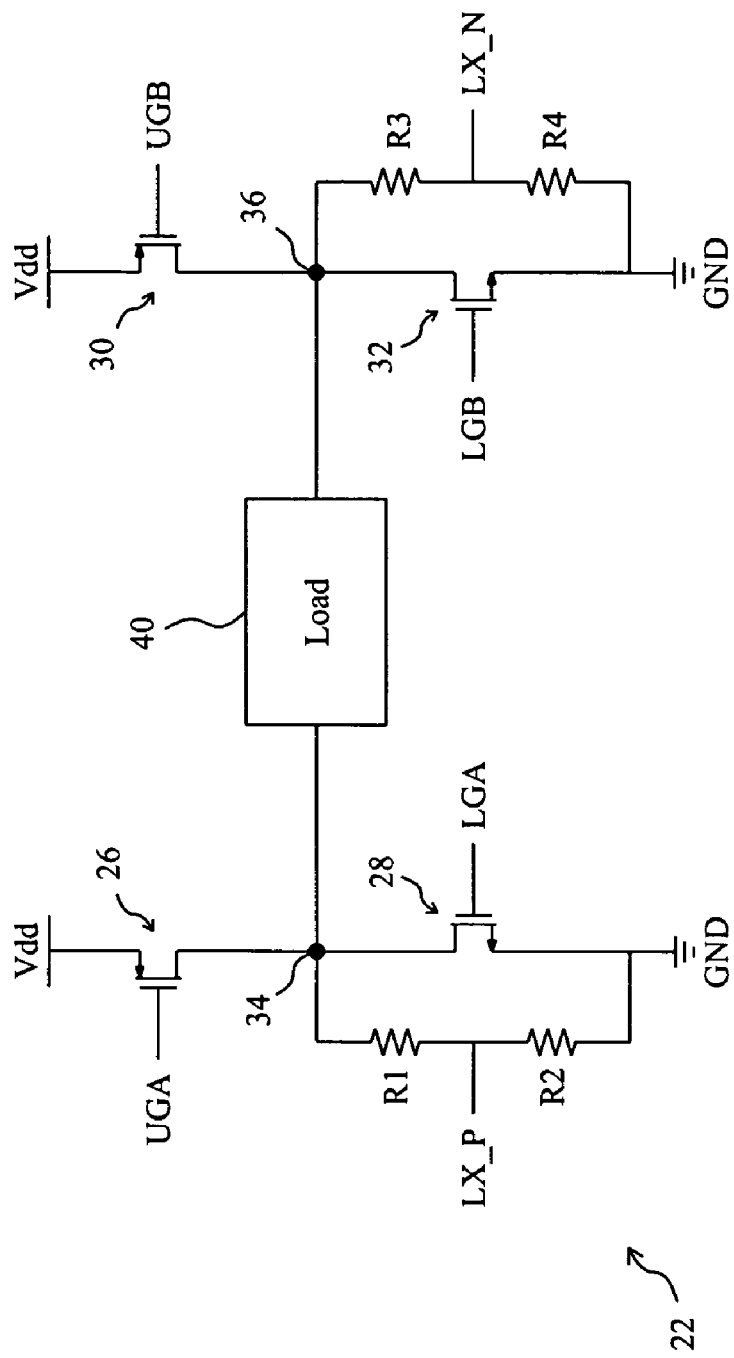
FIG. 2 is the circuit diagram of the power stage shown in FIG. 1.
Figure 3:
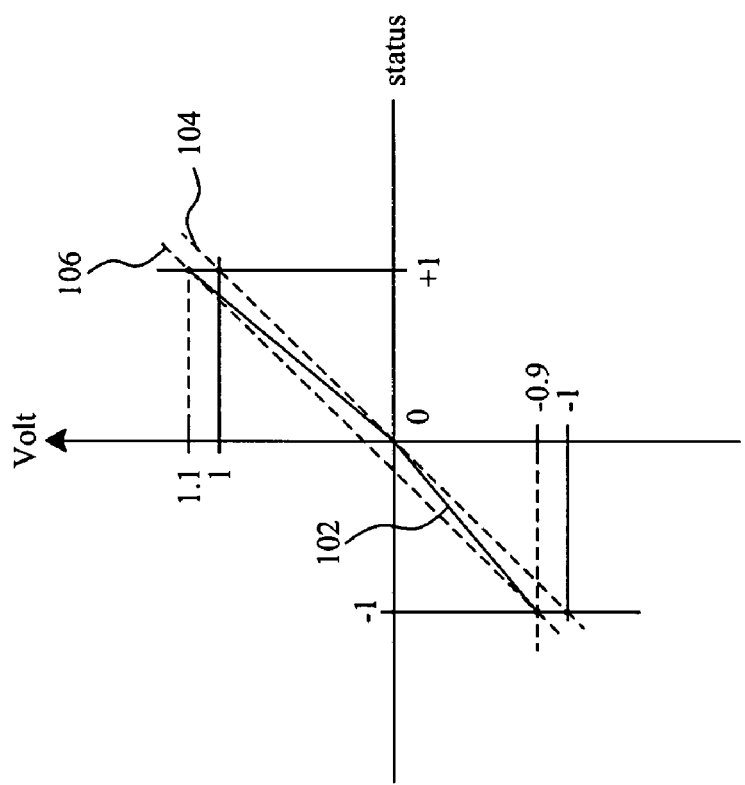
FIG. 3 is a diagram showing the voltage variation curve of a conventional 1.5-bit Σ-Δ class-D amplifier.

Referring to the H-bridge in FIG. 2 and the conversion circuit of FIG. 4, a first feedback signal includes a first positive feedback signal LX_P and a first negative feedback signal LX_N extracted from the power stage 22 and connected to the positive input terminal and the negative input terminal of the operational amplifier 44 respectively. The control signals CK1 and CK2 are used to control different switches. By switching on or off different switches, the transmission paths of the first positive feedback signal LX_P and the first negative feedback signal LX_N can be altered so that these signals will or will not be inverted or mixed. When the switches under control of the signal CK1 are switched on, and the switches under control of the signal CK2 are switched off, it determines a second feedback signal VDAC_P=LX_P and VDAC_N=LX_N. On the contrary, when the switches under control of the signal CK1 are switched off, and the switches under control of the signal CK2 are switched on, it determines the second feedback signal VDAC_P=−LX_N and VDAC_N=−LX_P. The second feedback signal VDAC_P and VDAC_N will replace the first feedback signal LX_P and LX_N to be used for feedback control in the control circuit of the class-D amplifier.

Taking a case where the first voltage is 1.1V, the second voltage is −0.9V, R1=R2, and R3=R4 as an example, when the quantized output is +1, the MOSes 26 and 32 are turned on and the MOSes 28 and 30 are turned off, in which case the first positive feedback signal LX_P=1.1V/2=0.55V and the first negative feedback signal LX_N=0. When the quantized output is −1, the MOSes 26 and 32 are turned off and the MOSes 28 and 30 are turned on, in which case the first positive feedback signal LX_P=0 and the first negative feedback signal LX_N=−0.9V/2=−0.45V. When the quantized output is 0, the MOSes 28 and 32 are turned on and the MOSes 26 and 30 are turned off, in which case the output terminals 34 and 36 are grounded, the voltage across the load 40 is zero and both LX_P and LX_N are zero.

Figure 5:
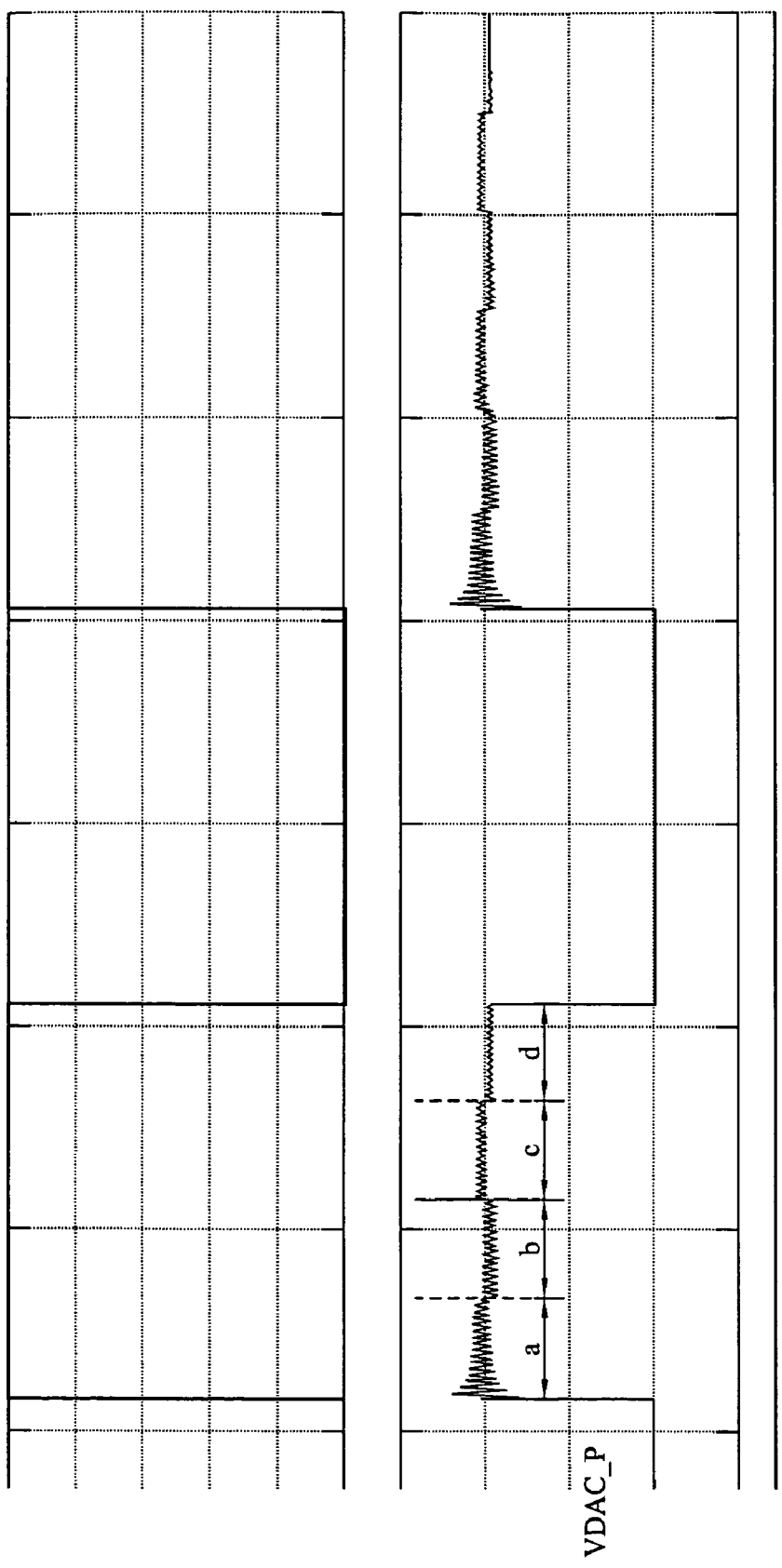
FIG. 5 is the waveform diagram of a feedback signal generated by the circuit shown in FIG. 4.

After the first positive feedback signal LX_P and the first negative feedback signal LX_N are inverted and mixed by the conversion circuit of FIG. 4, a second feedback signal including the second positive feedback signal VDAC_P and the second negative feedback signal VDAC_N are generated. The second positive feedback signal VDAC_P has the waveform as shown in FIG. 5, in which it has the value 0.55V in region a, −(−0.45V) in region b, back to 0.55V in region c, and then back to −(−0.45V) again in region d. As a result, the second positive signal VDAC_P has an average of (0.55V+0.45V)/2=0.5V. Likewise, the second negative feedback signal VDAC_N has an average of [−0.45V+(−0.55V)]/2=−0.5V. Hence, the first feedback signals LX_P and LX_N with poor linearity are now modified into the second feedback signals VDAC_P and VDAC_N with better linearity for use in the feedback control of the class-D amplifier. The switching speed of the control signals CK1 and CK2 may be altered to adjust the time durations of the regions a, b, c and d.

Figure 6:
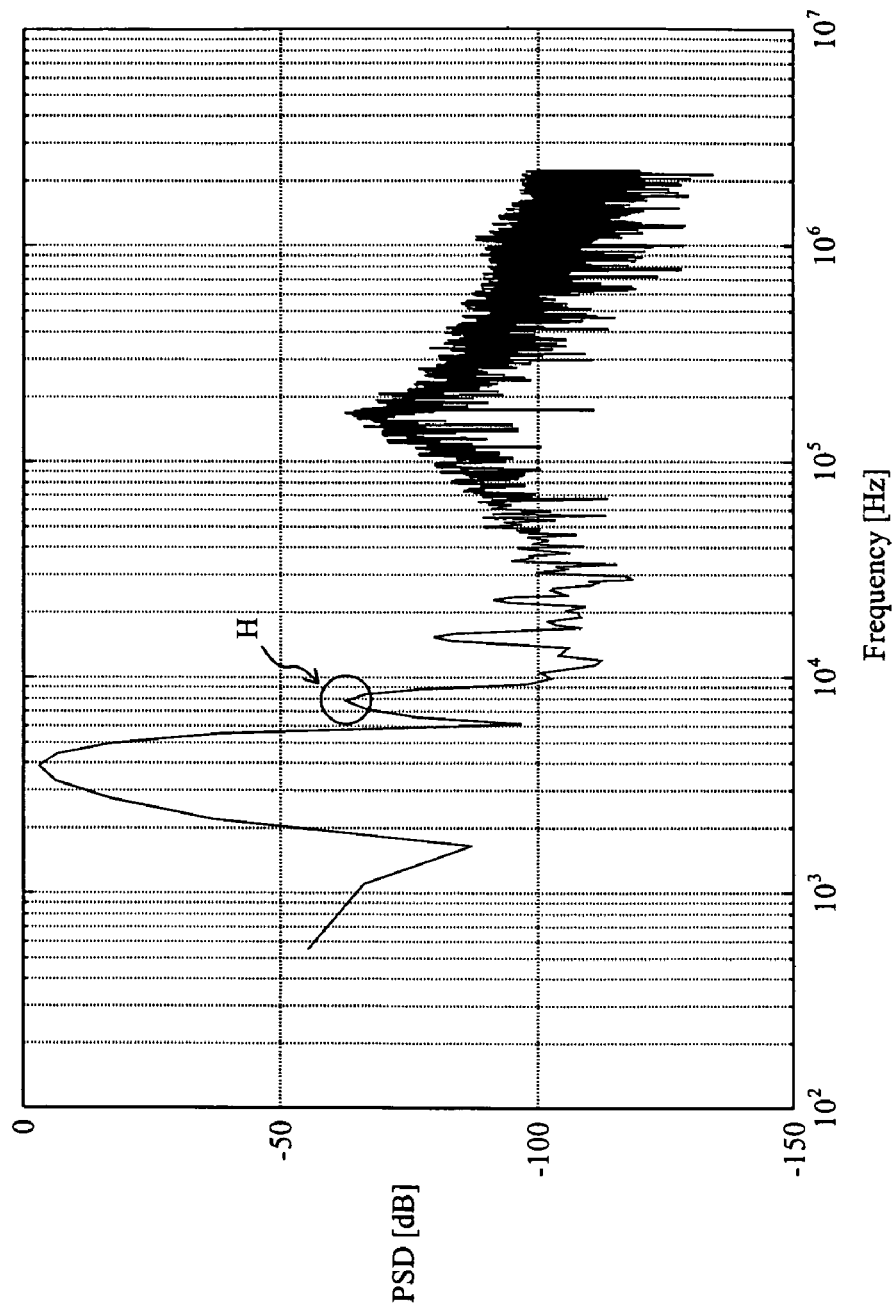
FIG. 6 is a simulated output spectrum of a conventional class-D amplifier with 1% resistor mismatch.
Figure 7:
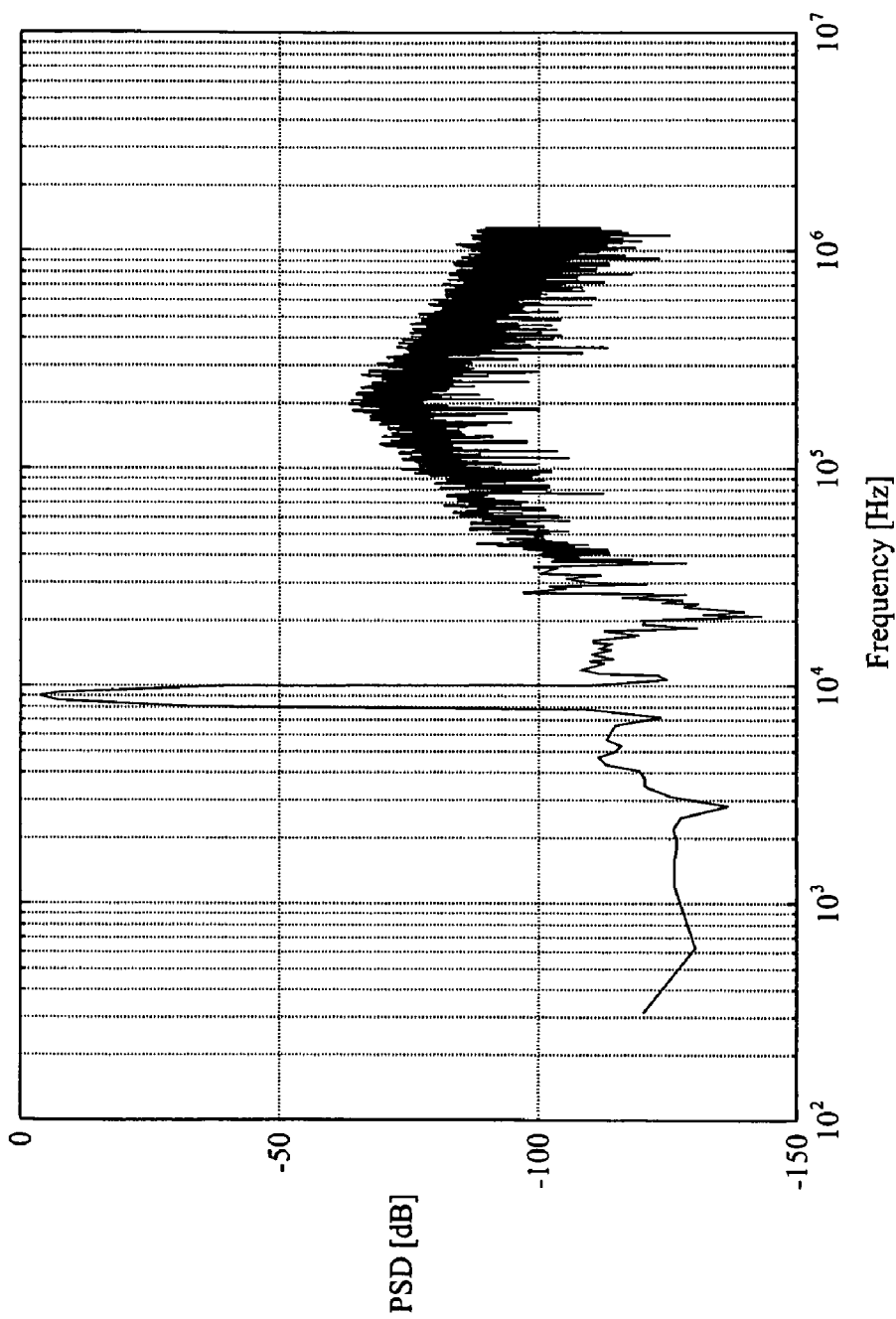
FIG. 7 is a simulated output spectrum of an inventive class-D amplifier with 1% resistor mismatch.

FIG. 6 is a simulated output spectrum when using the first feedback signals LX_P and LX_N directly for feedback control in a class-D amplifier with 1% resistor mismatch. As can be seen, a great frequency peak H occurs at a the output spectrum. FIG. 7 is a simulated output spectrum when using the second feedback signals VDAC_P and VDAC_N for feedback control in a class-D amplifier with 1% resistor mismatch. As can be seen, the frequency peak H at the output spectrum has been eliminated, which represents an improvement of the THD+N.

While the present invention has been described in conjunction with preferred embodiments thereof, it is evident that many alternatives, modifications and variations will be apparent to those skilled in the art. Accordingly, it is intended to embrace all such alternatives, modifications and variations that fall within the spirit and scope thereof as set forth in the appended claims.

What is claimed is:

1. An apparatus for improving the feedback linearity of a 1.5-bit Σ-Δ class-D amplifier, comprising:
   a control circuit;
   a power stage coupled to said control circuit, said control circuit operating said power stage to provide a tri-level output voltage of said 1.5 bit Σ-Δ class-D amplifier, the apparatus being coupled in a feedback path of said 1.5-bit Σ-Δ class-D amplifier between an output of said power stage and an input of said control circuit thereof;
   an input terminal receiving a first positive feedback signal and a first negative feedback signal from the output of said power stage;
   a conversion circuit connected to the input terminal of said apparatus, said conversion circuit comprising a plurality of operational amplifiers and a plurality of switches coupled therebetween, said switches selectively configuring positive and negative interconnections between said operational amplifier, said switches in at least one state crossing said positive and negative interconnections to invert or mix the first positive feedback signal and the first negative feedback signal received from said power stage of said 1.5-bit Σ-Δ class-D amplifier to determine a second positive feedback signal and a second negative feedback signal; and
   an output terminal of said apparatus connected to the conversion circuit and providing the second positive feedback signal and the second negative feedback signal to the input of said control circuit of said 1.5-bit Σ-Δ class-D amplifier for feedback control thereof.

2. The apparatus of claim 1, wherein the conversion circuit comprises two operational amplifiers connected in series.

3. The apparatus of claim 2, wherein each of the two operational amplifiers has a positive unit gain and a negative unit gain.

4. The apparatus of claim 2, wherein the conversion circuit further comprises a plurality of switches connected between the input terminal and the two operational amplifiers.

5. The apparatus of claim 2, wherein the conversion circuit further comprises a plurality of switches connected between the two operational amplifiers.

6. A method for improving the feedback linearity of a 1.5-bit Σ-Δ amplifier including a control circuit and a power stage coupled to said control circuit, said control circuit operating said power stage to provide a tri-level output voltage of said 1.5-bit Σ-Δ class-D amplifier for a load circuit, the method comprising the steps of:

coupling a conversion circuit in a feedback path of said 1.5-bit Σ-Δ class-D amplifier between an output of said power stage and an input of said control circuit thereof, said conversion circuit comprising a plurality of operational amplifiers and a plurality of switches coupled therebetween, said switches selectively configuring positive and negative interconnections between said operational amplifier, said switches in at least one state crossing said positive and negative interconnections;

receiving a first positive feedback signal and a first negative feedback signal output from the power stage;

configuring said switches to invert and mix the first positive feedback signal and the first negative feedback signal in said conversion circuit to determine a second positive feedback signal and a second negative feedback signal; and providing the second positive feedback signal and the second negative feedback signal to the control circuit of said 1.5-bit Σ-Δ class-D amplifier for feedback control thereof.

7. A 1.5-bit Σ-Δ class-D amplifier, comprising:

a control circuit;

a power stage connected to the control circuit for being operated by the control circuit to provide a tri-level output voltage; and a feedback linearity unit coupled in a feedback path of said 1.5-bit Σ-Δ class-D amplifier between an output of said power stage and an input of said control circuit thereof, wherein said feedback linearity unit includes:

an input terminal connected to the power stage for receiving a first positive feedback signal and a first negative feedback signal from the power stage, a conversion circuit connected to the input terminal comprising a plurality of operational amplifiers and a plurality of switches coupled therebetween, said switches selectively configuring positive and negative interconnections between said operational amplifier, said switches in at least one state crossing said positive and negative interconnections to invert or mix the first positive feedback signal and the first negative feedback signal to determine a second positive feedback signal and a second negative feedback signal, and an output terminal connected to the conversion circuit for providing the second positive feedback signal and the second negative feedback signal to the input of said control circuit of said 1.5-bit Σ-Δ class-D amplifier for feedback control thereof.

8. The class-D amplifier of claim 7, wherein the conversion circuit comprises two operational amplifiers connected in series.

9. The class-D amplifier of claim 8, wherein each of the two operational amplifiers has a positive unit gain and a negative unit gain.

10. The class-D amplifier of claim 8, wherein the conversion circuit further comprises a plurality of switches connected between the input terminal and the two operational amplifiers.

11. The class-D amplifier of claim 8, wherein the conversion circuit further comprises a plurality of switches connected between the two operational amplifiers.

* * * * *